United States Patent
Imai et al.

(10) Patent No.: US 8,358,129 B2
(45) Date of Patent: Jan. 22, 2013

(54) SIGNAL TRANSMITTING DEVICE HAVING OUTPUT CIRCUIT FOR VOLTAGE COMPARISON

(75) Inventors: Takakazu Imai, Tokyo (JP); Reiji Okuno, Tokyo (JP)

(73) Assignee: TDK Corporation, Tokyo (JP)

( * ) Notice: Subject to any disclaimer, the term of this patent is extended or adjusted under 35 U.S.C. 154(b) by 383 days.

(21) Appl. No.: 12/591,646

(22) Filed: Nov. 25, 2009

(65) Prior Publication Data

US 2010/0127803 A1      May 27, 2010

(30) Foreign Application Priority Data

Nov. 27, 2008   (JP) ................................. 2008-302583

(51) Int. Cl.
*G01R 33/02*     (2006.01)
(52) U.S. Cl. ........................................ 324/252; 324/244
(58) Field of Classification Search ........................ None
See application file for complete search history.

(56) References Cited

U.S. PATENT DOCUMENTS

| | | | |
|---|---|---|---|
| 6,300,617 B1 | 10/2001 | Daughton et al. | |
| 6,376,933 B1 * | 4/2002 | Goetz et al. | 307/91 |
| 6,433,545 B1 * | 8/2002 | Kunze et al. | 324/252 |
| 6,496,002 B1 * | 12/2002 | Kogiso et al. | 324/207.21 |
| 6,750,751 B2 * | 6/2004 | Wan | 336/200 |
| 7,375,516 B2 * | 5/2008 | Takenaga et al. | 324/252 |

FOREIGN PATENT DOCUMENTS

JP        A-2003-526083          9/2003

* cited by examiner

*Primary Examiner* — Minh N Tang
(74) *Attorney, Agent, or Firm* — Oliff & Berridge, PLC

(57) ABSTRACT

A magnetic coupling-type isolator includes a primary coil configured to generate a first magnetic field in accordance with an input signal, a bias coil configured to generate a second magnetic field in accordance with a bias signal, a first magneto-resistive element having a magnetic resistance increased by the first magnetic field and decreased by the second magnetic field, a second magneto-resistive element having a magnetic resistance decreased by the first magnetic field and increased by the second magnetic field, and a comparator configured to output an output signal in accordance with a difference between the magnetic resistance of the first magneto-resistive element and the magnetic resistance of the second magneto-resistive element.

16 Claims, 9 Drawing Sheets

SIGNAL TRANSMITTING DEVICE HAVING OUTPUT CIRCUIT FOR VOLTAGE COMPARISON

BACKGROUND OF THE INVENTION

1. Field of the Invention

The present invention relates to a signal transmitting device which converts an input signal into an output signal by detecting a change in intensity of a magnetic field caused by a change of the input signal as a change in magnetic resistance of a magneto-resistive element.

2. Description of the Related Art

A magnetic coupling-type isolator may be used as an isolator for transmitting a digital or analog signal, and is applied, e.g., to an interface for connecting a computer with its peripheral device, an interface for connecting between circuits of different potentials, or an interface for use in a relay transmission device on a communication network. The magnetic coupling-type isolator provides an electrical insulation between an input and an output, and also detects a change in intensity of the magnetic field caused by a change of the input signal as a change in magnetic resistance of a magneto-resistive element, so as to convert the input signal into an output signal. As an example of the magnetic coupling-type isolator, Japanese Patent Laid-open Publication (translation version) No 2003-526083 discloses a magnetic digital signal coupler which uses a magneto-resistive element having a memory effect. In the magnetic digital signal coupler disclosed therein, a pulse signal is generated at a time when a logic state of an input signal changes, and the pulse signal is input into the magneto-resistive element. According to this configuration, the magnetic resistance can be maintained over a period during which the logic state of the input signal remains unchanged.

The magnetic digital signal coupler described above, however, requires a circuit for generating a pulse signal at the time when the logic state of the input signal changes. This increases the circuit scale as well as cost. Furthermore, it has been pointed out that the coupler has poor reliability with respect to noise, because if false information is once stored in the magneto-resistive element due to the noise applied from the outside, the false information will be retained in the magneto-resistive element from the time of input of the noise to the time when the logic state of the input signal changes.

SUMMARY OF THE INVENTION

In view of the foregoing, an object of the present invention is to provide a signal transmitting device having a simple circuit configuration.

To achieve the above object, a signal transmitting device according to the present invention includes: a first conductor configured to generate a first magnetic field in accordance with an input signal; a second conductor configured to generate a second magnetic field in accordance with a bias signal; a first magneto-resistive element having a magnetic resistance increased by the first magnetic field and decreased by the second magnetic field; a second magneto-resistive element having a magnetic resistance decreased by the first magnetic field and increased by the second magnetic field; and an output circuit configured to output an output signal in accordance with a difference between the magnetic resistance of the first magneto-resistive element and the magnetic resistance of the second magneto-resistive element. Here, the first magneto-resistive element includes a first magnetization pinned layer having a magnetization direction fixed in a direction approximately perpendicular to a longitudinal direction of the first magneto-resistive element, and a first magnetization free layer having a magnetization direction changed by actions of the first magnetic field and the second magnetic field, and the second magneto-resistive element includes a second magnetization pinned layer having a magnetization direction fixed in a direction approximately perpendicular to a longitudinal direction of the second magneto-resistive element, and a second magnetization free layer having a magnetization direction changed by actions of the first magnetic field and the second magnetic field.

According to the signal transmitting device of the present invention, the input signal is converted into the output signal on the basis of the magnetic resistances of the magneto-resistive elements which do not have the memory effect. Therefore, it is unnecessary to shape the waveform of the input current flowing through the first conductor into a pulse signal or the like, and accordingly, the circuit configuration can be simplified. Moreover, it is possible to prevent the noise from being stored due to the memory effect, which ensures high reliability with respect to the noise.

A signal transmitting device according to another aspect of the present invention includes: a first conductor configured to generate a first magnetic field in accordance with an input signal; a second conductor configured to generate a second magnetic field in accordance with a bias signal; a magneto-resistive element having a magnetic resistance increased by the first magnetic field and decreased by the second magnetic field, or having a magnetic resistance decreased by the first magnetic field and increased by the second magnetic field; and an output circuit configured to output an output signal in accordance with the magnetic resistance of the magneto-resistive element.

According to the present invention, the input signal is converted into the output signal on the basis of the magnetic resistance of the magneto-resistive element which does not have the memory, effect. Therefore, the waveform of the input current flowing through the first conductor does not have to be shaped into a pulse signal or the like, and thus, the circuit configuration can be simplified. Moreover, high reliability with respect to the noise is ensured.

DESCRIPTION OF THE PREFERRED EMBODIMENTS

Figure 1:
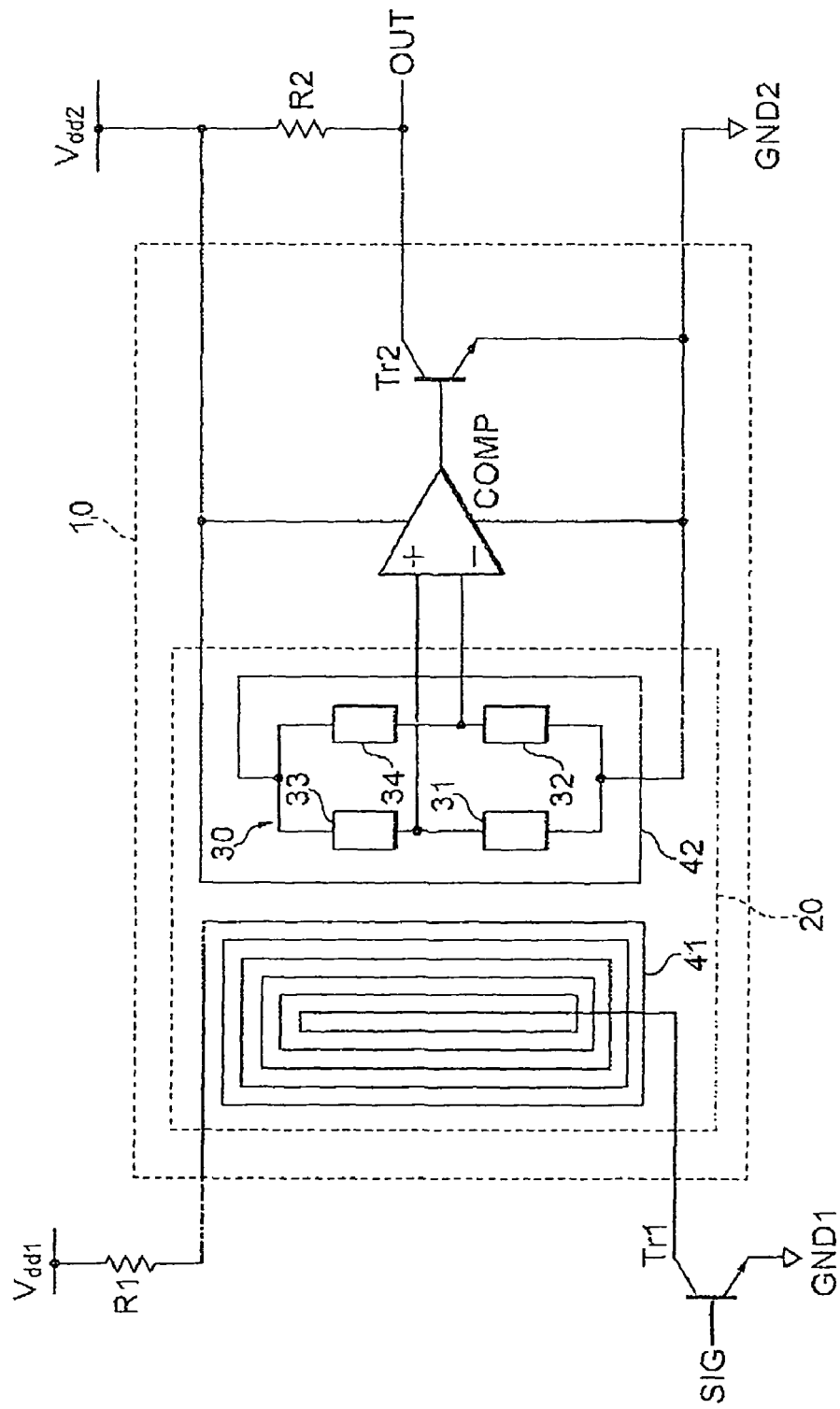
FIG. 1 is a main circuit diagram of a magnetic coupling-type isolator according to a first embodiment of the present invention.

Hereinafter, embodiments of the present invention will be described with reference to the drawings. In the following, like elements are denoted by like reference characters, and description thereof will not be repeated.

[First Embodiment]

FIG. 1 is a main circuit diagram of a magnetic coupling-type isolator 10 according to a first embodiment. The magnetic coupling-type isolator 10 is an insulated interface which provides both an electrical insulation between an input and an output and a signal coupling function. The magnetic coupling-type isolator 10 may be referred to as a signal isolation device or a signal transmitting device. The magnetic coupling-type isolator 10 primarily includes a magnetic coupler element 20 and a comparator COMP.

The magnetic coupler element 20 includes: a primary coil 41 made up of a conductor through which an input current as an input signal flows; a detection bridge circuit 30 having a plurality of magneto-resistive elements 31, 32, 33, and 34 bridge-connected with each other; and a bias coil 42 made up of a conductor through which a bias current as a bias signal flows. The detection bridge circuit 30 has a circuit configuration in which a set of the two magneto-resistive elements 31 and 33 connected in series and a set of the two magneto-resistive elements 32 and 34 connected in series are connected in parallel. The detection bridge circuit 30 detects a change in intensity of a magnetic field caused by a change of the input signal as a change in magnetic resistance of the magneto-resistive elements 31 and 32 (or as a change in magnetic resistance of the magneto-resistive elements 33 and 34).

The primary coil 41 has a first terminal (plus terminal) connected to a power supply potential Vdd1 via a resistance R1, and a second terminal (minus terminal) connected to a collector terminal of a grounded-emitter transistor Tr1. The transistor Tr1 has an emitter terminal connected to a ground potential GND1, and a base terminal receiving an input signal SIG as a digital signal. It is noted that the resistance R1, which is provided for restricting the current flowing through the primary coil 41, is an optional element.

The comparator COMP is configured to calculate a difference between a voltage V1 input into a non-inverting input terminal and a voltage V2 input into an inverting input terminal, and output a low-level signal when a value of V1−V2 is not greater than a first threshold value Vth1 and output a high-level signal when the value of V1−V2 is not lower than a second threshold value Vth2, where the second threshold value Vth2 is greater than the first threshold value Vth1. As will be understood from the description below, the comparator COMP functions as an output circuit which outputs an output signal OUT in accordance with a difference between the magnetic resistance of the magneto-resistive element 31 and the magnetic resistance of the magneto-resistive element 32 (or a difference between the magnetic resistance of the magneto-resistive element 33 and the magnetic resistance of the magneto-resistive element 34).

A connecting point between the magneto-resistive element 31 and the magneto-resistive element 33 is connected to the non-inverting input terminal of the comparator COMP, and a connecting point between the magneto-resistive element 32 and the magneto-resistive element 34 is connected to the inverting input terminal of the comparator COMP. The comparator COMP has a power supply terminal connected to a power supply potential Vdd2, and a ground terminal connected to a ground potential GND2. The comparator COMP has an output terminal connected to a base terminal of a grounded-emitter transistor Tr2. The transistor Tr2 has an emitter terminal connected to the ground potential GND2, and a collector terminal which constitutes an output terminal from which an output signal OUT is output. The collector terminal of the transistor Tr2 is also connected to the power supply potential Vdd2 via a resistance R2. The bias coil 42 has one end connected to the power supply potential Vdd2, and the other end connected to a connecting point between the magneto-resistive element 33 and the magneto-resistive element 34. A connecting point between the magneto-resistive element 31 and the magneto-resistive element 32 is connected to the ground potential GND2.

It is noted that the power supply potential Vdd2 is a potential which is applied to a power supply terminal by means for applying a predetermined potential (which is, e.g., a constant voltage source or a constant current source). In the first embodiment, the ground potential GND2 may be replaced with a predetermined potential (applied by means for applying the predetermined potential (e.g., a constant voltage source or a constant current source)) that is lower than the power supply potential Vdd2.

Figure 2:
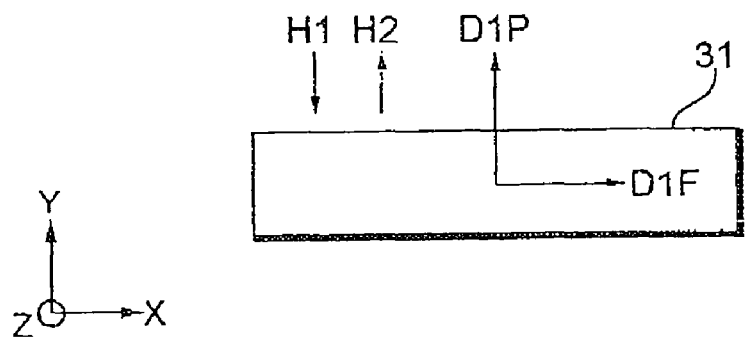
FIGS. 2 to 4 each illustrate a relation between a magneto-resistive element and external magnetic fields.

Now, a relation between the magneto-resistive element 31 and an external magnetic field will be described with reference to FIG. 2. For convenience of explanation, an XYZ orthogonal coordinate system is defined, which has X direction corresponding to a longitudinal direction of the magneto-resistive element 31. The magneto-resistive element 31 is a spin-valve GMR element having a magneto-resistive film, in which a magnetization pinned layer (not shown) which is made up of a ferromagnetic material and whose magnetization direction is fixed in one direction, a conductor layer (not shown) which is made up of a non-magnetic material and through which a sense current for detecting a magnetic resistance flows, and a magnetization free layer (not shown) which is made up of a ferromagnetic material and whose magnetization direction is changed by an action of the external magnetic field, are stacked successively. Here, the magnetization direction D1P of the magnetization pinned layer is fixed in a direction (e.g., +Y direction) approximately perpendicular to the longitudinal direction (±X direction) of the magneto-resistive element 31. In the absence of the external magnetic field, the magnetization direction D1F of the magnetization free layer is in parallel with the longitudinal direction (±X direction) of the magneto-resistive element 31, whereas in the presence of the external magnetic field, the magnetization direction D1F of the magnetization free layer changes in accordance with the action of the external magnetic field (or, in the case where there are a plurality of external magnetic fields, in accordance with the action of a synthetic magnetic field of those magnetic fields).

It is known that the magnetic resistance of the magneto-resistive element 31 has a characteristic that its value changes approximately linearly with respect to the intensity of the external magnetic field in the case where the magnetization direction D1P of the magnetization pinned layer is fixed in a direction approximately perpendicular to the longitudinal direction of the magneto-resistive element 31. This characteristic enables, in the circuit shown in FIG. 1, a signal that is approximately proportional to the input signal to be taken out as a differential output signal. It is also known that, when the magnetization direction D1P of the magnetization pinned layer is fixed in the direction approximately perpendicular to the longitudinal direction of the magneto-resistive element 31, as compared with the case where it is fixed in a direction approximately horizontal to the longitudinal direction of the magneto-resistive element 31, there is a less hysteresis with respect to the intensity of the external magnetic field. Thus, in the circuit shown in FIG. 1, when the input signal changes to "0", it is unlikely that the previously input signal is retained (memory effect), and accordingly, it is possible to take out a signal approximately proportional to the input signal as the differential output signal.

In the present embodiment, it is adjusted such that the magnetization direction D1P of the magnetization pinned layer and the direction of the magnetic field H1 generated by the primary coil 41 are in parallel with and opposite from each other, and such that the magnetization direction D1P of the magnetization pinned layer and the direction of the magnetic field H2 generated by the bias coil 42 are in parallel with and identical to each other. It is also adjusted such that the magnetic field H1 is greater in terms of intensity than the magnetic field H2. Accordingly, in the case where only the magnetic field H2 acts on the magneto-resistive element 31, the magnetization direction D1F of the magnetization free layer is in parallel with and identical to the magnetization direction D1P of the magnetization pinned layer (i.e., in the parallel state), so that the rate of change of the magnetic resistance takes a negative value, resulting in a low-resistance state. On the other hand, in the case where the magnetic field H1 and the magnetic field H2 simultaneously act on the magneto-resistive element 31, the direction of the synthetic magnetic field of the magnetic fields H1 and H2 is the same as the direction of the magnetic field H1, and thus, the magnetization direction D1F of the magnetization free layer is in parallel with and opposite from the magnetization direction D1P of the magnetization pinned layer (i.e., in the anti-parallel state). Accordingly, the rate of change of the magnetic resistance takes a positive value, resulting in a high-resistance state.

Figure 3:
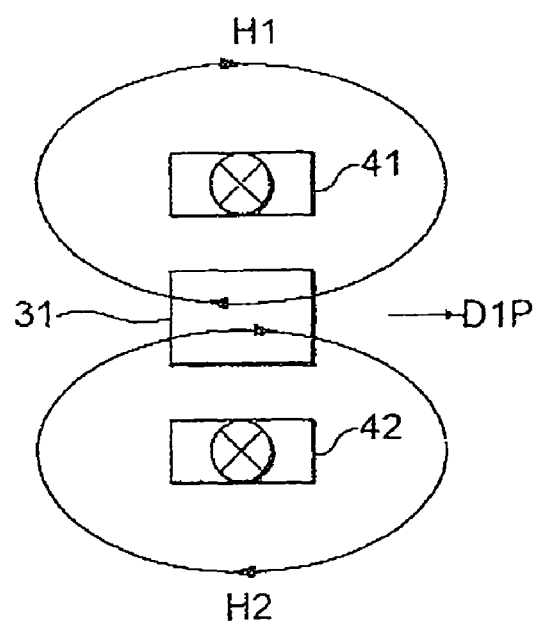
Figure 4:
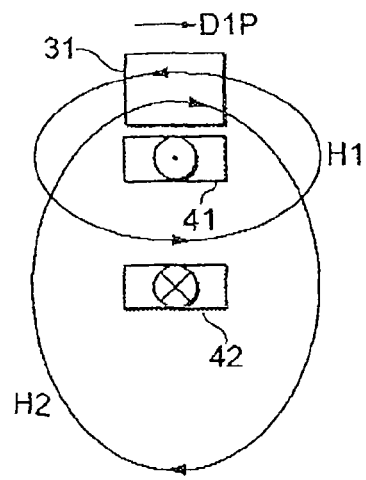

It is noted that the physical positional relationship between the magneto-resistive element 31, the primary coil 41, and the bias coil 42 may take various forms, as shown in FIGS. 3 and 4 for example, as long as the relation between the magnetization direction D1P and the direction of the external magnetic field the directions of the respective magnetic fields H1 and H2) satisfies the above-described relationship. In FIG. 3, it is assumed that the input current and the bias current both flow in the direction from the front side toward the rear side of the paper plane. In FIG. 4, it is assumed that the bias current flows in the direction from the front side toward the rear side of the paper plane, and the input current flows in the direction from the rear side toward the front side of the paper plane. It is noted that the physical positional relations in FIGS. 3 and 4 are only illustrative; the present embodiment is not limited thereto.

Figure 5:
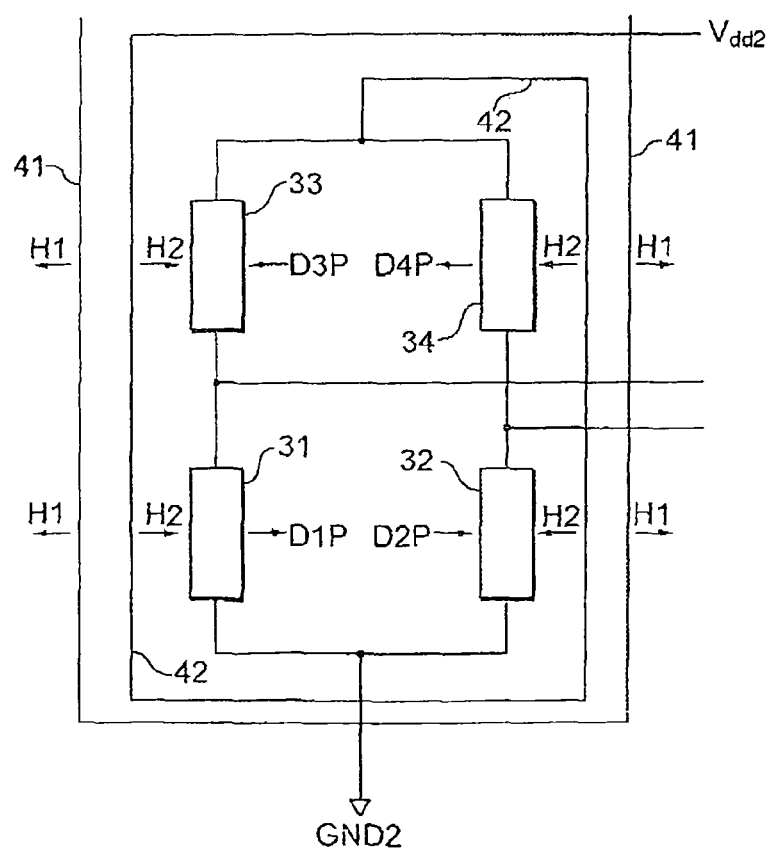
FIG. 5 illustrates a relation between magneto-resistive elements and external magnetic fields.

Hereinafter, a relation between the magneto-resistive elements 31, 32, 33, and 34 and the external magnetic fields will be described with reference to FIG. 5. Each of the magneto-resistive elements 32, 33, and 34 is a spin-valve GMR element having a magneto-resistive film made up of a magnetization pinned layer, conductor layer, and magnetization free layer successively stacked on one another, as in the magneto-resistive element 31. It is adjusted such that the magnetization direction D2P of the magnetization pinned layer in the magneto-resistive element 32 and the direction of the magnetic field H1 generated by the primary coil 41 are in parallel with and identical to each other, and such that the magnetization direction D2P of the magnetization pinned layer in the magneto-resistive element 32 and the direction of the magnetic field H2 generated by the bias coil 42 are in parallel with and opposite from each other. Further, it is adjusted such that the magnetization direction D3P of the magnetization pinned layer in the magneto-resistive element 33 and the direction of the magnetic field H1 generated by the primary coil 41 are in parallel with and identical to each other, and such that the magnetization direction D3P of the magnetization pinned layer in the magneto-resistive element 33 and the direction of the magnetic field H2 generated by the bias coil 42 are in parallel with and opposite from each other. Still further, it ds adjusted such that the magnetization direction D4P of the magnetization pinned layer in the magneto-resistive element 34 and the direction of the magnetic field H1 generated by the primary coil 41 are in parallel with and opposite from each other, and such that the magnetization direction D4P of the magnetization pinned layer in the magneto-resistive element 34 and the direction of the magnetic field H2 generated by the bias coil 42 are in parallel with and identical to each other.

When the relation between the magneto-resistive elements 31, 32, 33, and 34 and the external magnetic fields is adjusted as described above, the magneto-resistive elements 31 and 34 each have the magnetic resistance increased by the action of the magnetic field H1 and decreased by the action of the magnetic field H2, while the magneto-resistive elements 32 and 33 each have the magnetic resistance decreased by the action of the magnetic field H1 and increased by the action of the magnetic field H2. The bias coil 42 is supplied with a bias current from the power supply potential Vdd2 irrespective of the logical value of the input signal SIG. Thus, when the logical value of the input signal SIG is "0", the magnetic field H2 acts on each of the magneto-resistive elements 31, 32, 33, and 34. Then, the magneto-resistive elements 31 and 34 are in a low-resistance state, while the magneto-resistive elements 32 and 33 are in a high-resistance state. When a potential difference between the potential at the connecting point of the magneto-resistive elements 31 and 33 and the ground potential GND2 is represented by V1 and a potential difference between the potential at the connecting point of the magneto-resistive elements 32 and 34 and the ground potential GND2 is represented by V2, the value of V1−V2 takes a negative value when the logical value of the input signal SIG is "0". On the other hand, when the logical value of the input signal SIG is "1", the synthetic magnetic field of the magnetic fields H1 and H2 acts on each of the magneto-resistive elements 31, 32, 33, and 34. As a result, the magneto-resistive elements 31 and 34 are in a high-resistance state, and the magneto-resistive elements 32 and 33 are in a low-resistance state, whereby V1−V2 takes a positive value.

Figure 6:
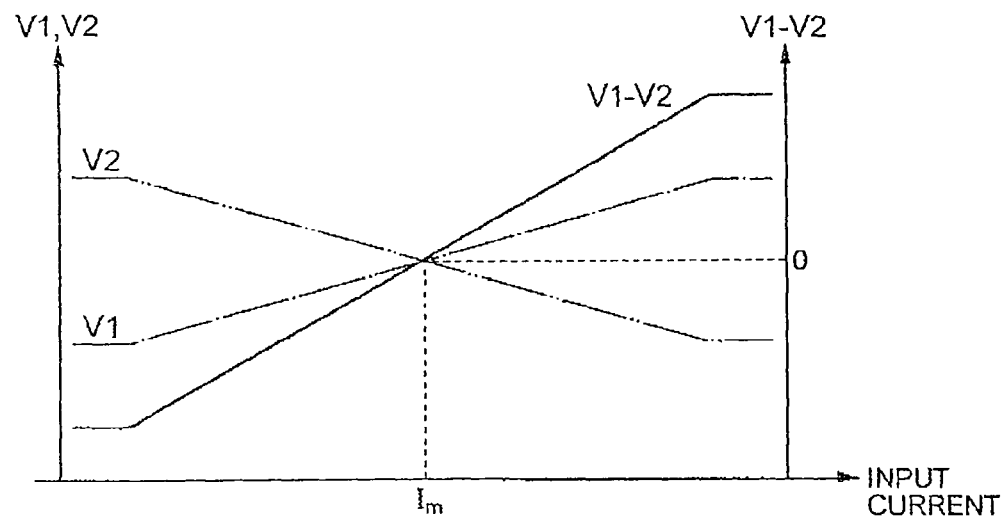
FIG. 6 is a graph illustrating a relation between an input current and voltages.

Now, a relation between the input current I and voltages (V1, V2, V1−V2) will be described with reference to FIG. 6. As the input current I flowing through the primary coil 41 increases, the voltage V1 increases linearly and the voltage V2 decreases linearly. When the input current I is Im, the magnetic field H1 and the magnetic field H2 have the same magnetic field intensity, so that the voltages V1 and V2 become equal, causing V1−V2 to be zero.

Figure 7:
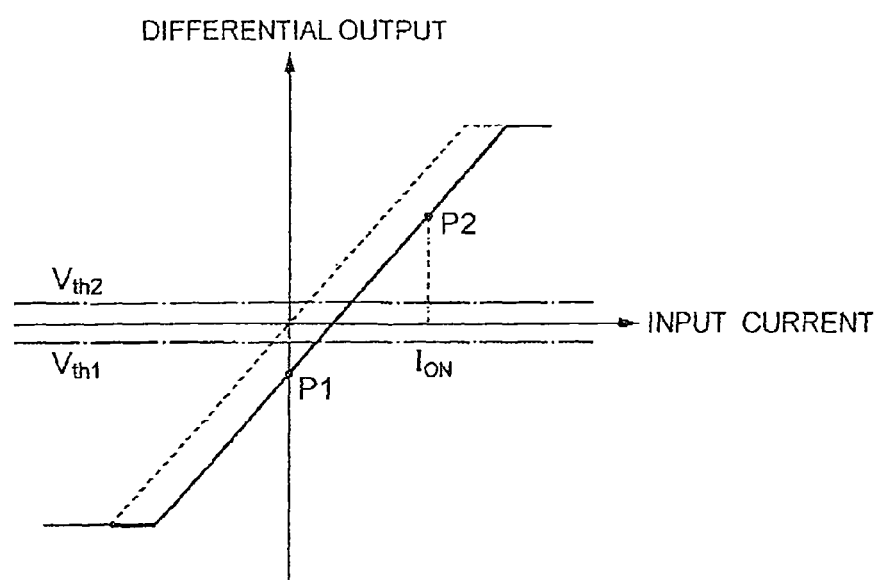
FIG. 7 illustrates an operating point of a detection bridge circuit.

Hereinafter, an operating point of the detection bridge circuit 30 will be described with reference to FIG. 7. In FIG. 7, the horizontal axis represents the input current I flowing through the primary coil 41, and the vertical axis represents the differential output (V1−V2) of the detection bridge circuit 30. The solid line graph corresponds to the case where the bias current flows through the bias coil 42, and the broken line graph corresponds to the case where no bias current flows through the bias coil 42. Further, in FIG. 7, first and second threshold values of the comparator COMP are shown as Vth1 and Vth2, respectively.

When the input current I is zero (i.e., when the logical value of the input signal SIG is "0"), the operating point of the detection bridge circuit 30 is located at P1, and the value of V1−V2 at that time is adjusted so as to be smaller than the first threshold value Vth1 of the comparator. When the input current I is $I_{ON}$ (i.e., when the logical value of the input signal SIG is "1"), the operating point of the detection bridge circuit 30 is located at P2, and the value of V1−V2 at that time is adjusted so as to be greater than the second threshold value Vth2 of the comparator.

When Im is adjusted to $I_{ON}/2$, the operating point at the time when V1−V2=0 is located in between the first threshold value Vth1 and the second threshold value Vth2, which effectively prevents a false determination from being made by the comparator COMP.

Figure 8:
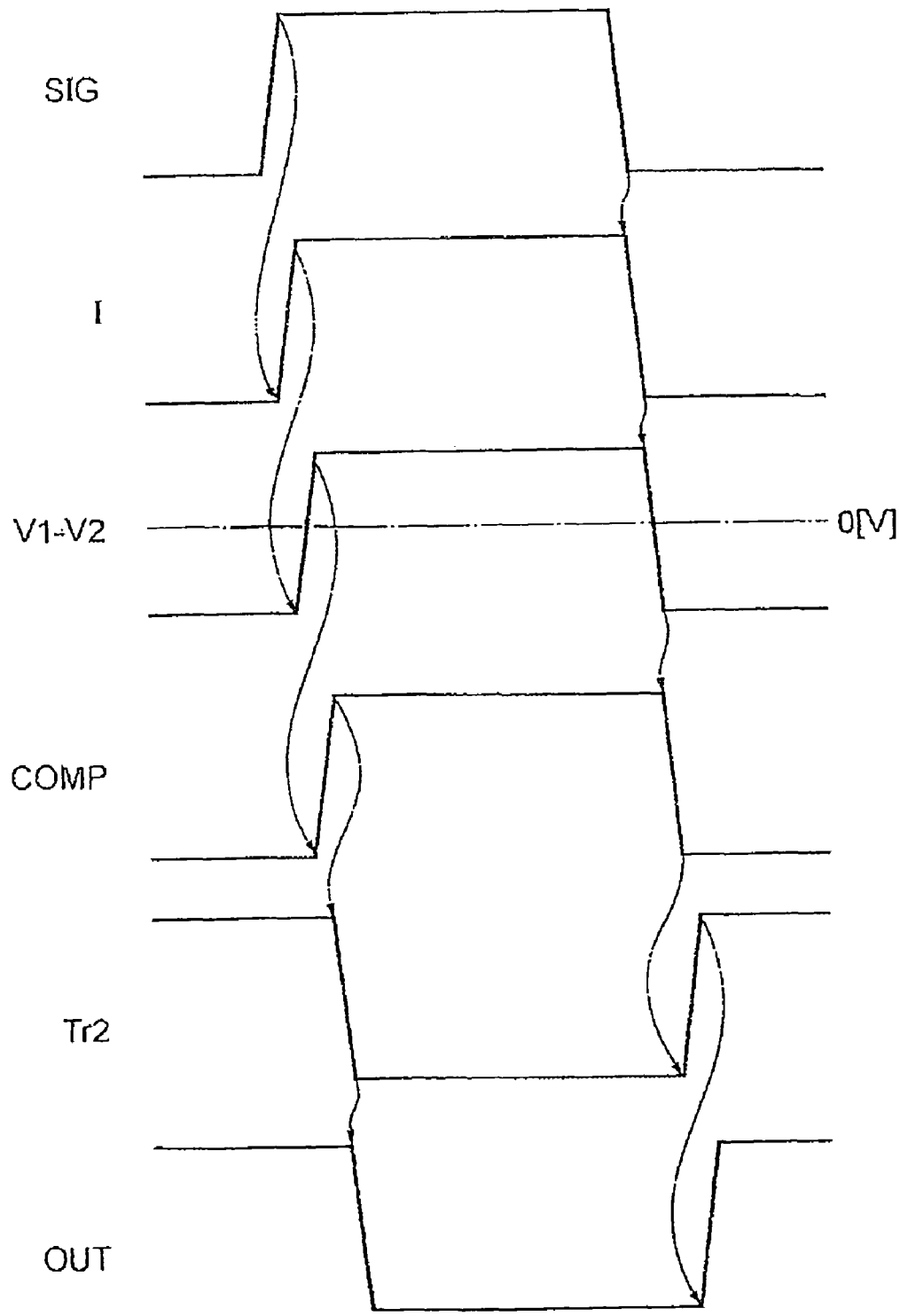
FIG. 8 is a timing chart illustrating an operation of the magnetic coupling-type isolator.

Now, an operation of the magnetic coupling-type isolator 10 will be described with reference to FIG. 8. When the input signal SIG takes a logical value of "0", the transistor Tr1 has a base potential of a low level, so that the transistor Tr1 attains an off state, causing no input current I to flow through the primary coil 41. The value of V1−V2 has been adjusted so as to be smaller than the first threshold value Vth1 during the time when only the magnetic field H2 acts on the detection bridge circuit 30, and thus, the output value of the comparator COMP becomes low. Then, the transistor Tr2 has a base potential of a low level, and accordingly, the transistor Tr2 attains an off state, and its collector potential becomes high. As a result, the output signal OUT has a logical value of a high level.

On the other hand, when the input signal SIG takes a logical value of "1", the base potential of the transistor Tr1 becomes high, so that the transistor Tr1 attains an on state. Accordingly, the input current $I_{ON}$ flows through the primary coil 41. The value of V1−V2 has been adjusted so as not to be lower than the second threshold value Vth2 during the time when the magnetic fields H1 and H2 simultaneously act on the detection bridge circuit 30, and thus, the output value of the comparator COMP becomes high. Correspondingly, the base potential of the transistor Tr2 becomes high, and thus, the transistor Tr2 attains an on state, and its collector potential becomes low. As a result, the output signal OUT has a logical value of a low level.

The first circuit configuration has been described above, in which the bias coil 42 has one end connected to the connecting point between the magneto-resistive elements 33 and 34 and the other end connected to the power supply potential Vdd2, so as to allow the bias current generated by the potential difference between the power supply potential Vdd2 and the ground potential GND2 to flow through the bias coil 42. Alternatively, a second circuit configuration may be adopted, in which the bias coil 42 has one end connected to the connecting point between the magneto-resistive elements 31 and 32 and the other end connected to the ground potential GND2, so as to allow the bias current generated by the potential difference between the power supply potential Vdd2 and the ground potential GND2 to flow through the bias coil 42. In both of the first and second circuit configurations, the current path for the sense current and the current path for the bias current are the same. (This means that the sense current and the bias current are substantially the same.) By making the current path for the sense current and the current path for the bias current the same, as described above, an additional circuit for the bias current becomes unnecessary. This can reduce the number of parts and also reduce consumed power. It is noted that the current path for the sense current and the current path for the bias current do not have to be the same; they may be provided separately from each other, in which case the sense current and the bias current will be different from each other.

Furthermore, the magneto-resistive elements 31, 32, 33, and 34 are not restricted to the spin-valve GMR elements as described above; they may be TMR elements, for example.

According to the first embodiment, the detection bridge circuit 30 is constituted by the magneto-resistive elements 31, 32, 33, and 34 each having the magnetization pinned layer whose magnetization direction is fixed in a direction approximately perpendicular to the longitudinal direction of the magneto-resistive element, and having no memory effect. Therefore, the waveform of the input current flowing through the primary coil 41 does not have to be shaped into a pulse signal or the like. This leads to a simplified circuit configuration and also ensures high reliability with respect to the noise. Furthermore, as compared with the case of using a half bridge circuit, the use of the bridge circuit enables cancellation of offset components, whereby more stable operations are ensured.

Furthermore, in the related art where the bias coil 42 is not provided, the differential output (V1−V2) at the time when the input current is zero is approximately zero, and the operating point P1 is located within an indefinite area between the first threshold value Vth1 and the second threshold value Vth2, making the operation of the comparator COMP unstable. By comparison, in the first embodiment, the bias current flows through the bias coil 42 irrespective of the logical value of the input signal SIG. Thus, the differential output (V1−V2) at the time when the input current is zero can be adjusted so as to be less than the first threshold value Vth1, which leads to a stable operation of the comparator COMP. Although it may be conceivable to adjust both the first threshold value Vth1 and the second threshold value Vth2 so as to prevent the operating point P1 on the differential output (V1−V2) at the time when the input current is zero from falling within the indefinite area, the operating point of the comparator COMP needs to be changed in an absolute value. In order to determine the absolute value in an IC, the IC needs to have a reference voltage therein, which increases the circuit scale and also increases the variation, resulting in an increased cost required for adjustment. In view of the foregoing, it is preferable to cause the bias current to flow through the bias coil 42, as in the present embodiment, while applying no electrical offset to the first threshold value Vth1 and the second threshold value Vth2, so that the differential output (V1−V2) when the input current is zero is adjusted to be less than the first threshold value Vth1.

[Second Embodiment]

Figure 9:
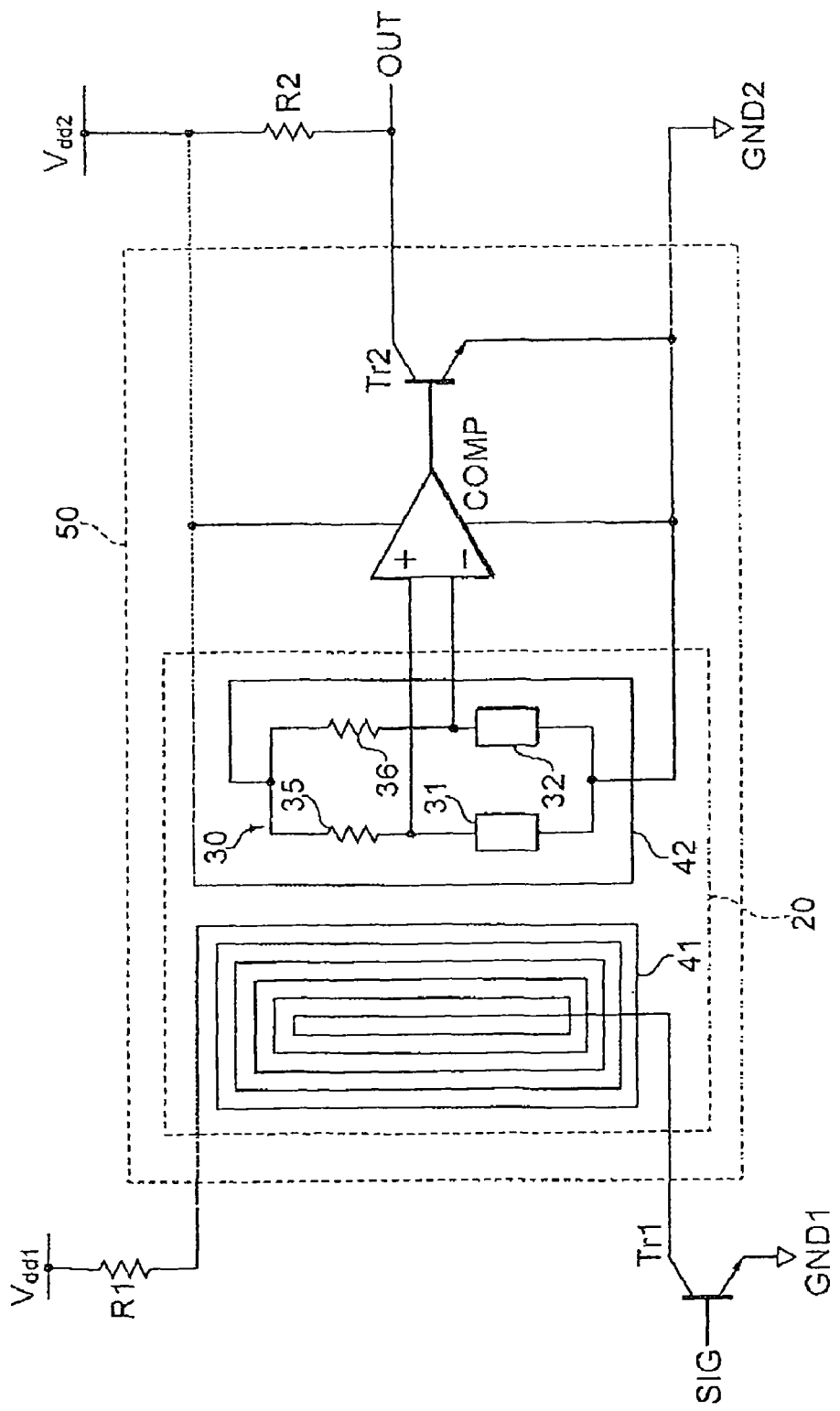
FIG. 9 is a main circuit diagram of the magnetic coupling-type isolator according to a second embodiment of the present invention.

FIG. 9 is a main circuit diagram of a magnetic coupling-type isolator 50 according to a second embodiment of the present invention. The configuration of the second embodiment is identical to that of the first embodiment except that the detection bridge circuit 30 in the magnetic coupling-type isolator 50 has a circuit configuration in which a set of a magneto-resistive element 31 and a resistance element 35 connected in series and a set of a magneto-resistive element 32 and a resistance element 36 connected in series are connected in parallel. The resistance element 35 and the resistance element 36 preferably have the same resistance value, and more preferably have the same temperature-resistance characteristics. The magnetic coupling-type isolator 50 according to the second embodiment has the functions similar to, and exerts the functional effects similar to, those of the magnetic coupling-type isolator 10 of the first embodiment.

[Third Embodiment]

Figure 10:
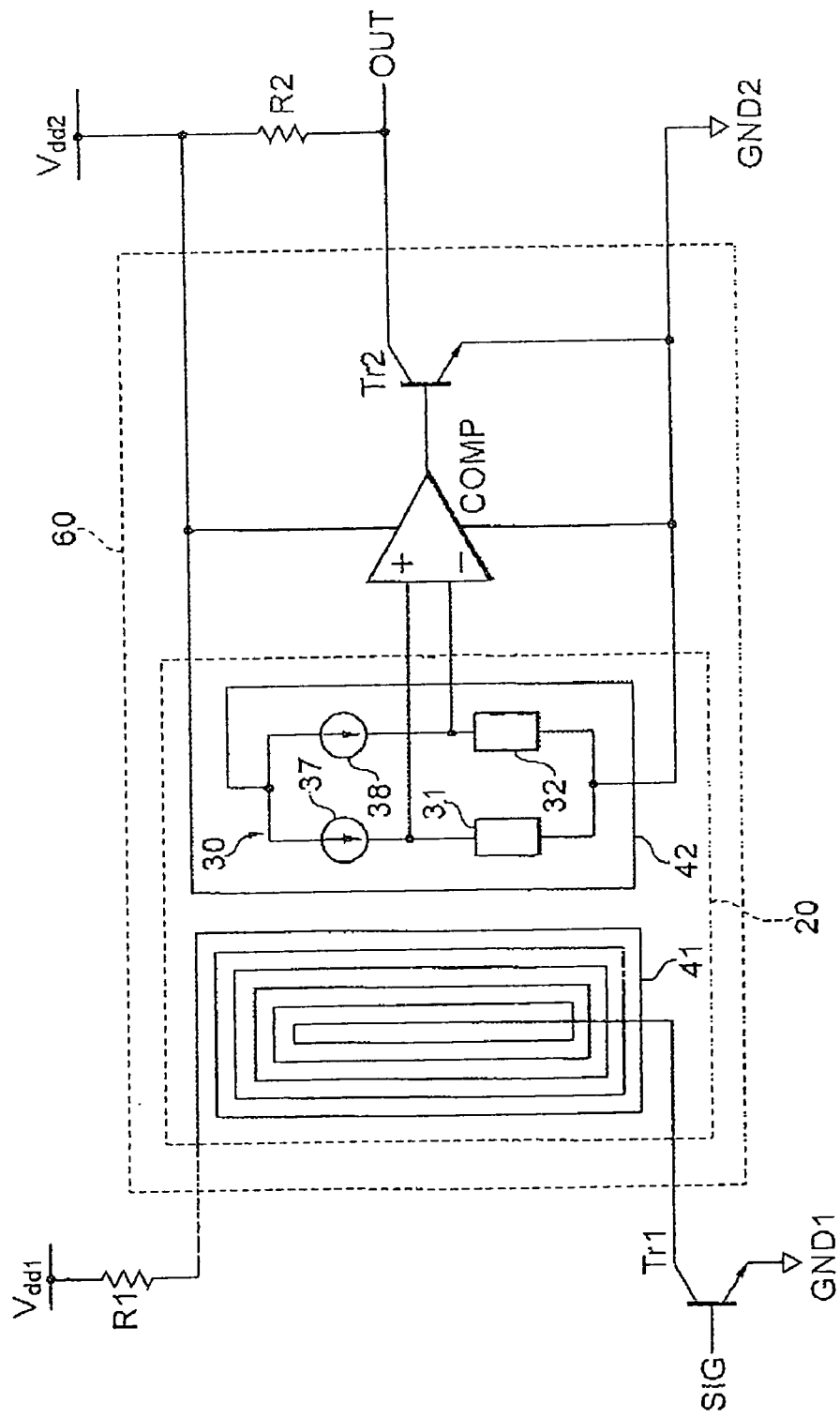
FIG. 10 is a main circuit diagram of the magnetic coupling-type isolator according to a third embodiment of the present invention.

FIG. 10 is a main circuit diagram of a magnetic coupling-type isolator 60 according to a third embodiment of the present invention. The configuration of the third embodiment is identical to that of the first embodiment except that the detection bridge circuit 30 in the magnetic coupling-type isolator 60 has a circuit configuration in which a set of a magneto-resistive element 31 and a constant current source 37 connected in series and a set of a magneto-resistive element 32 and a constant current source 38 connected in series are connected in parallel. The constant current source 37 and the constant current source 38 preferably supply the current of the same value to the magneto-resistive element 31 and the magneto-resistive element 32, respectively. The use of the constant current sources 37 and 38 enables implementation of the detection bridge circuit 30 including only two magneto-resistive elements 31 and 32 as shown in FIG. 10, unlike the detection bridge circuit 30 shown in FIG. 10, which requires four magneto-resistive elements 31, 32, 33, and 34. This advantageously reduces the circuit scale. The magnetic coupling-type isolator 60 according to the third embodiment has the functions similar to, and exerts the functional effects similar to, those of the magnetic coupling-type isolator 10 of the first embodiment.

[Fourth Embodiment]

Figure 11:
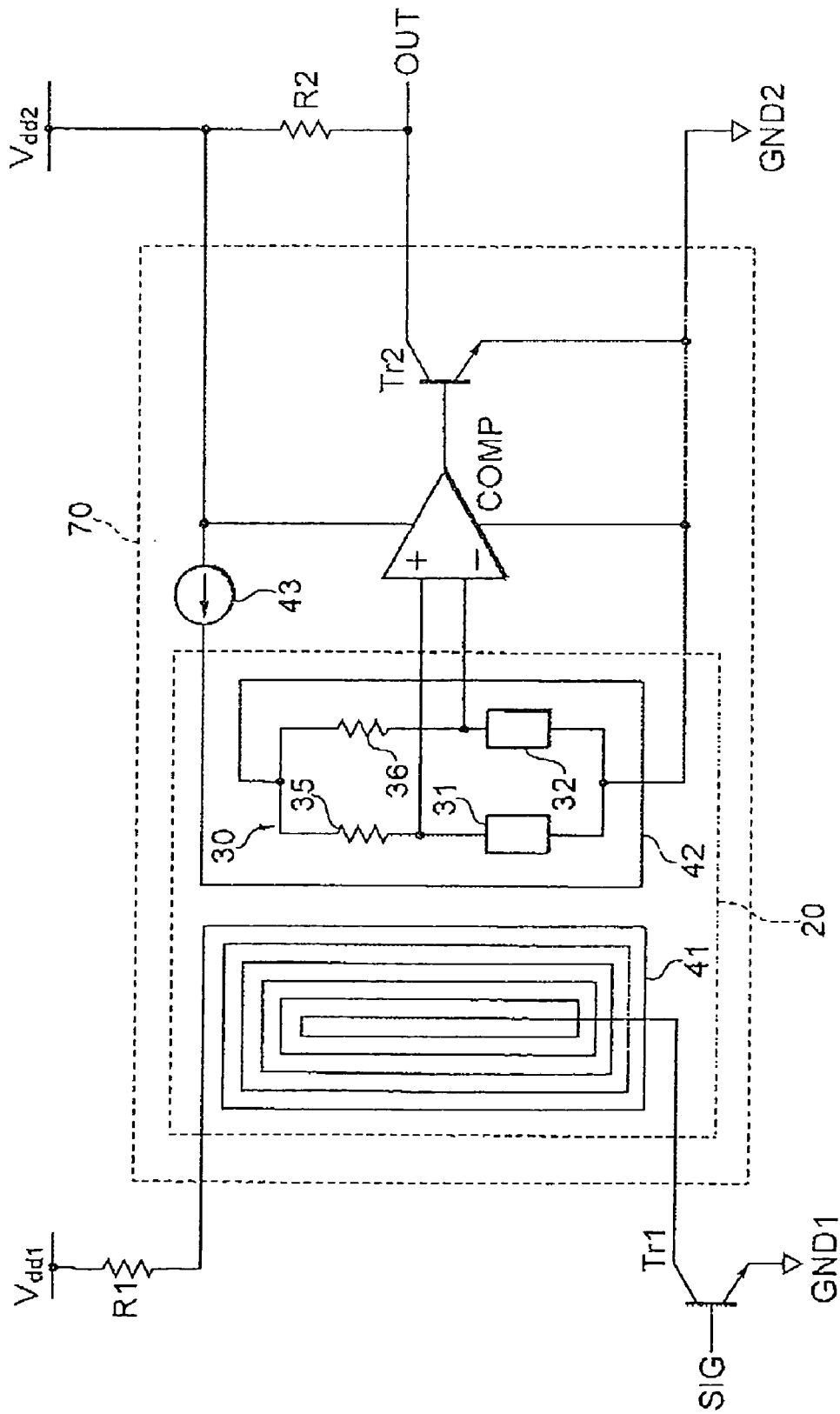
FIG. 11 is a main circuit diagram of the magnetic coupling-type isolator according to a fourth embodiment of the present invention.

FIG. 11 is a main circuit diagram of a magnetic coupling-type isolator 70 according to a fourth embodiment of the present invention. The configuration of the fourth embodiment is identical to that of the second embodiment except that the bias coil 42 has one end connected to the connecting point between the resistance element 35 and the resistance element 36 and the other end connected to a constant current source 43 serving as potential applying means. The magnetic coupling-type isolator 70 according to the fourth embodiment has the functions similar to, and exerts the functional effects similar to, those of the magnetic coupling-type isolator 50 of the second embodiment. Particularly, in the magnetic coupling-type isolator 60 according to the third embodiment, when the magnetic resistances of the magneto-resistive elements 31 and 32 steeply change, the values of the currents supplied from the constant current sources 37 and 38 may vary. In contrast, according to the magnetic coupling-type isolator 70 of the fourth embodiment, even in the case where the magnetic resistances of the magneto-resistive elements 31 and 32 change steeply (as in the case where a high-speed signal is input), if the magnetic resistance value of the magneto-resistive element 31 becomes lower, the magnetic resistance value of the magneto-resistive element 32 will become higher correspondingly, so that the current of a constant amount when viewed as a whole will flow through the magneto-resistive elements 31 and 32. Therefore, as long as the resistance values of the resistance elements 35 and 36 are sufficiently smaller than that of the constant current source 43, the magneto-resistive elements 31 and 32 may be supplied with the currents in correspondence with their magnetic resistances, respectively, with no change in total amount of the current supplied from the constant current source 43. As a result, a more stable output can be obtained.

It is noted that the connecting point between the resistance elements 35 and 36 may be connected to the power supply potential Vdd2 and the connecting point between the magneto-resistive elements 31 and 32 may be connected to the constant current source 43. In this case, the constant current source 43 has one end connected to the connecting point between the magneto-resistive elements 31 and 32 and the other end connected to the ground potential GND2.

[Fifth Embodiment]

Figure 12:
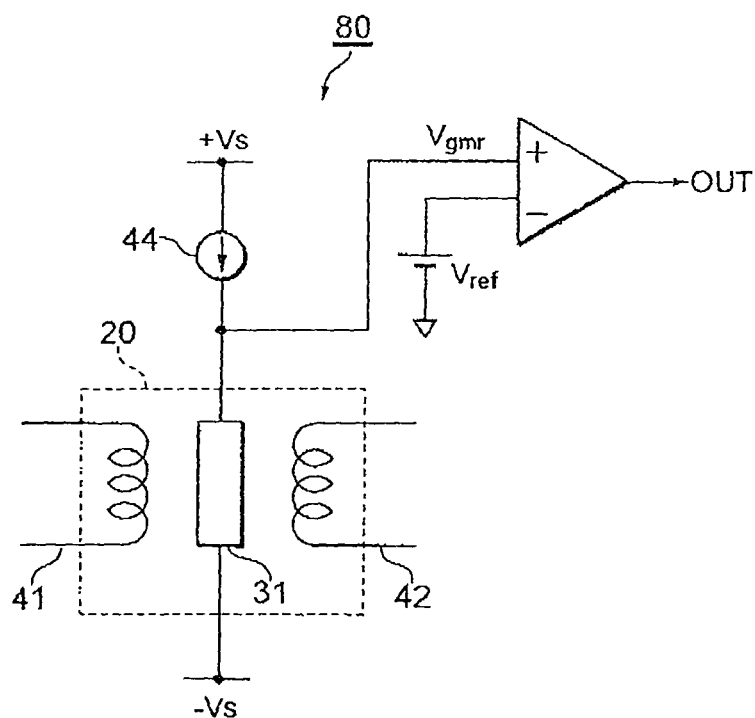
FIGS. 12 and 13 are main circuit diagrams of the magnetic coupling-type isolator according to a fifth embodiment of the present invention.

FIG. 12 is a main circuit diagram of a magnetic coupling-type isolator 80 according to a fifth embodiment of the present invention. The magnetic coupling-type isolator 80 primarily includes a magnetic coupler element 20 and a comparator COMP. The magnetic coupler element 20 includes: a primary coil 41 made up of a conductor through which an input current as an input signal flows; a bias coil 42 made up of a conductor through which a bias current as a bias signal flows; and a magneto-resistive element 31. The magneto-resistive element 31 has one end connected to a constant current source 44 which supplies a sense current (constant current) to the magneto-resistive element 31, and the other end connected to a potential −Vs. Further, the constant current source 44 has one end connected to a potential +Vs, and the other end connected to one end of the magneto-resistive element 31. In the magneto-resistive element 31, the magnetization direction of the magnetization pinned layer is fixed in a direction approximately perpendicular to the longitudinal direction of the magneto-resistive element 31, so that the magnetic resistance of the magneto-resistive element 31 increases due to the magnetic field generated by the primary coil 41 and decreases due to the magnetic field generated by the bias coil 42 (or, so that the magnetic resistance decreases due to the magnetic field generated by the primary coil 41 and increases due to the magnetic field generated by the bias coil 42).

The comparator COMP is configured to calculate a difference between a voltage Vgmr of the magneto-resistive element 31 (=sense current×magnetic resistance) and a reference voltage Vref, and output a low-level signal when the value of Vgmr−Vref is not greater than a first threshold value Vth1 and output a high-level signal when the value of Vgmr−Vref is not smaller than a second threshold value Vth2. In this manner, the comparator COMP functions as an output circuit which outputs an output signal OUT on the basis of the magnetic resistance of the magneto-resistive element 31.

It is noted that, although the magnetic coupler element 20 included in the magnetic coupling-type isolator 80 of the fifth embodiment differs from the magnetic coupler element 20 included in the magnetic coupling-type isolator 10 of the first embodiment in that the magnetic coupler element 20 of the fifth embodiment is constituted by one magneto-resistive element 31, the primary coil 41, and the bias coil 42, and the magnetic coupler element 20 of the first embodiment is constituted by the detection bridge circuit 30 made up of a plurality of magneto-resistive elements 31, 32, 33, and 34, the primary coil 41, and the bias coil 42, they are identical in terms of basic circuit configuration. Accordingly, the magnetic coupling-type isolator 80 according to the fifth embodiment has the functions similar to, and exerts the functional effects similar to, those of the magnetic coupling-type isolator 10 of the first embodiment.

Figure 13:
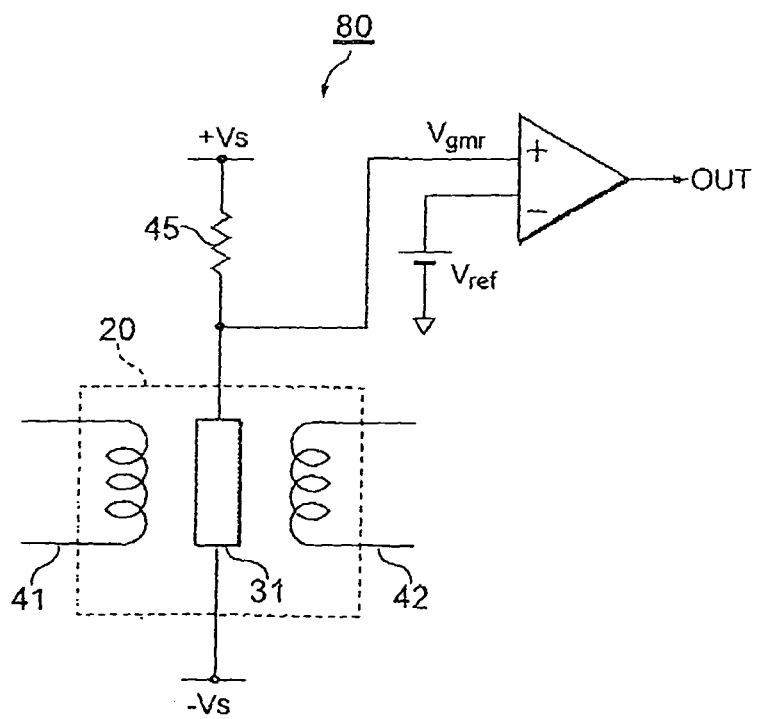

It is noted that the circuit configuration of the magnetic coupling-type isolator 80 is not restricted to the one shown in FIG. 12. For example, the constant current source 44 may be replaced with a resistance element 45, as shown in FIG. 13.

The present application is based on Japanese priority application No. 2008-302583 filed on Nov. 27, 2008, the entire content of which is hereby incorporated by reference.

What is claimed is:

1. A signal transmitting device comprising:
   a first conductor configured to generate a first magnetic field in accordance with an input signal;
   a second conductor configured to generate a second magnetic field in accordance with a bias signal;
   a first magneto-resistive element having a magnetic resistance increased by the first magnetic field and decreased by the second magnetic field;
   a second magneto-resistive element having a magnetic resistance decreased by the first magnetic field and increased by the second magnetic field; and an output circuit configured to compare a voltage varying in accordance with a difference between the magnetic resistance of the first magneto-resistive element and the magnetic resistance of the second magneto-resistive element, a first threshold value, and a second threshold value greater than the first threshold value and output an output signal having a first logical value when the voltage is smaller than the first threshold value and output an output signal having a second logical value when the voltage is greater than the second threshold value, wherein intensities and directions of the respective first and second magnetic fields are adjusted such that the voltage is smaller than the first threshold value when the input signal is zero.

2. The signal transmitting device according to claim 1, further comprising:

a third magneto-resistive element connected to the first magneto-resistive element; and a fourth magneto-resistive element connected to the second magneto-resistive element; wherein the third magneto-resistive element has a magnetic resistance decreased by the first magnetic field and increased by the second magnetic field, and the fourth magneto-resistive element has a magnetic resistance increased by the first magnetic field and decreased by the second magnetic field.

3. The signal transmitting device according to claim 2, further comprising:

first potential applying means for applying a first potential; and second potential applying means for applying a second potential which is lower than the first potential; wherein the second conductor is connected to the first potential or the second potential, and the second conductor constitutes part of a current path through which a bias current caused by a potential difference between the first potential and the second potential flows.

4. The signal transmitting device according to claim 2, further comprising:

first potential applying means for applying a first potential; and second potential applying means for applying a second potential which is lower than the first potential; wherein each of the first magneto-resistive element and the second magneto-resistive element is supplied with a sense current caused by a potential difference between the first potential and the second potential, and the first potential applying means or the second potential applying means is a constant current source.

5. The signal transmitting device according to claim 2, wherein the first magnetic field and the second magnetic field act on the third magneto-resistive element in approximately opposite directions, and the first magnetic field and the second magnetic field act on the fourth magneto-resistive element in approximately opposite directions.

6. The signal transmitting device according to claim 2, wherein the third magneto-resistive element includes a third magnetization pinned layer having a magnetization direction fixed in a direction approximately perpendicular to a longitudinal direction of the third magneto-resistive element, and a third magnetization free layer having a magnetization direction changed by actions of the first magnetic field and the second magnetic field, and the fourth magneto-resistive element includes a fourth magnetization pinned layer having a magnetization direction fixed in a direction approximately perpendicular to a longitudinal direction of the fourth magneto-resistive element, and a fourth magnetization free layer having a magnetization direction changed by actions of the first magnetic field and the second magnetic field.

7. The signal transmitting device according to claim 1, further comprising:

a first resistance element connected to the first magneto-resistive element; and a second resistance element connected to the second magneto-resistive element.

8. The signal transmitting device according to claim 1, further comprising:

a first constant current source connected to the first magneto-resistive element; and a second constant current source connected to the second magneto-resistive element.

9. The signal transmitting device according to claim 8, further comprising:

first potential applying means for applying a first potential; and second potential applying means for applying a second potential which is lower than the first potential; wherein the second conductor is connected to the first potential or the second potential, and the second conductor constitutes part of a current path through which a bias current caused by a potential difference between the first potential and the second potential flows.

10. The signal transmitting device according to claim 1, further comprising:

first potential applying means for applying a first potential; and second potential applying means for applying a second potential which is lower than the first potential; wherein the second conductor is connected to the first potential or the second potential, and the second conductor constitutes part of a current path through which a bias current caused by a potential difference between the first potential and the second potential flows.

11. The signal transmitting device according to claim 1, further comprising:

first potential applying means for applying a first potential; and second potential applying means for applying a second potential which is lower than the first potential; wherein each of the first magneto-resistive element and the second magneto-resistive element is supplied with a sense current caused by a potential difference between the first potential and the second potential, and the first potential applying means or the second potential applying means is a constant current source.

12. The signal transmitting device according to claim 1, wherein the first magnetic field and the second magnetic field act on the first magneto-resistive element in approximately opposite directions, and the first magnetic field and the second magnetic field act on the second magneto-resistive element in approximately opposite directions.

13. The signal transmitting device according to claim 1, wherein the first magneto-resistive element includes a first magnetization pinned layer having a magnetization direction fixed in a direction approximately perpendicular to a longitudinal direction of the first magneto-resistive element, and a first magnetization free layer having a magnetization direction changed by actions of the first magnetic field and the second magnetic field, and the second magneto-resistive element includes a second magnetization pinned layer having a magnetization direction fixed in a direction approximately perpendicular to a longitudinal direction of the second magneto-resistive element, and a second magnetization free layer having a magnetization direction changed by actions of the first magnetic field and the second magnetic field.

14. A signal transmitting device comprising:

a first conductor configured to generate a first magnetic field in accordance with an input signal;

a second conductor configured to generate a second magnetic field in accordance with a bias signal;

a magneto-resistive element having a magnetic resistance increased by the first magnetic field and decreased by the second magnetic field, or having a magnetic resistance decreased by the first magnetic field and increased by the second magnetic field; and an output circuit configured to compare a voltage difference between a reference voltage and a voltage varying in accordance with the magnetic resistance of the magneto-resistive element, a first threshold value, and a second threshold value greater than the first threshold value and output an output signal having a first logical value when the voltage difference is smaller than the first threshold value and output an output signal having a second logical value when the voltage difference is greater than the second threshold value, wherein intensities and directions of the respective first and second magnetic fields are adjusted such that the voltage difference is smaller than the first threshold value when the input signal is zero.

15. The signal transmitting device according to claim 14, wherein the first magnetic field and the second magnetic field act on the magneto-resistive element in approximately opposite directions.

16. The signal transmitting device according to claim 14, wherein the magneto-resistive element includes a magnetization pinned layer having a magnetization direction fixed in a direction approximately perpendicular to a longitudinal direction of the magneto-resistive element, and a magnetization free layer having a magnetization direction changed by actions of the first magnetic field and the second magnetic field.

* * * * *